(12) United States Patent  
Nakazawa et al.

(10) Patent No.: US 7,705,305 B2  
(45) Date of Patent: Apr. 27, 2010

(54) SAMPLE OBSERVATION METHOD AND TRANSMISSION ELECTRON MICROSCOPE

(75) Inventors: Eiko Nakazawa, Mito (JP); Hiroyuki Kobayashi, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 157 days.

(21) Appl. No.: 12/119,916

(22) Filed: May 13, 2008

(65) Prior Publication Data

US 2008/0283750 A1  Nov. 20, 2008

(30) Foreign Application Priority Data

May 14, 2007  (JP)  ............................. 2007-128392

(51) Int. Cl.  
*G01N 23/04*  (2006.01)

(52) U.S. Cl. ...................................... 250/311

(58) Field of Classification Search ................. 250/311  
See application file for complete search history.

(56) References Cited

U.S. PATENT DOCUMENTS 5,523,567 A     6/1996  Kawamata et al.  
7,544,936 B2 *  6/2009  Inada et al. ................. 250/307

FOREIGN PATENT DOCUMENTS

JP           7-130319 A     5/1995

* cited by examiner

*Primary Examiner*—Kiet T Nguyen  
(74) *Attorney, Agent, or Firm*—Crowell & Moring LLP

(57) ABSTRACT

There is provided a transmission electron microscope capable of a capturing continuous field-of-view image without having an influence of aberration. In order to obtain an electron beam image of the whole of a predetermined range of a sample, the transmission electron microscope specifies a region with little aberration in a field of view of an image pickup device, moves a sample stage in units of the specified regions, captures the whole of the predetermined range as a plurality of continuous field-of-view images.

12 Claims, 6 Drawing Sheets

$\Delta \phi = \tan^{-1}(r^2 \cdot Kr)$ $\triangle r = r^3 \cdot Kp \cdot M$

Distorted aberration

SAMPLE OBSERVATION METHOD AND TRANSMISSION ELECTRON MICROSCOPE

BACKGROUND OF THE INVENTION

1. Field of the Invention

The present invention relates to a transmission electron microscope and a method of observing a sample under a transmission electron microscope.

When a sample is observed under a transmission electron microscope, aberrations such as rotation aberrations or distorted aberrations (distortion) appear in magnified images due to the limits of lens characteristics. In an observation at a low magnification, the influence of aberrations is particularly noticeable. However, observations of wide fields at a very low magnification with a transmission electron microscope are demanded in application fields particularly such as pathological diagnosis.

In response to these needs, conventionally lens constitutions are altered, or a viewing coverage recorded on a recording medium, for example a range recorded to a film is changed so that lens aberrations may not be included within a field of view as few as possible.

On the other hand, in recent transmission electron microscopes, CCD cameras are used instead of films as recording media of images. However, it is impossible for general-purpose CCD cameras to obtain digital images with a resolution equivalent to that of films due to the limitation of pixel sizes. Thus, techniques of creating montage photos are used to improve the resolution of images.

The specification of Japanese Unexamined Patent Application Publication No. Hei 7-130319 (corresponding to U.S. Pat. No. 5,523,567) discloses that a sample is divided into a plurality of sections and that an image data per section obtained by electron beam scanning is recorded in a frame memory to display a low magnification image.

SUMMARY OF THE INVENTION

In the creation of a montage photo, the presence of an aberration in images causes a problem that the images cannot be linked together. The conventional arts, however, do not involve any countermeasures for removing an aberration region appearing in an image or for correcting an image. Accordingly, the conventional arts fail to capture a continuous field-of-view image without having an influence of aberration.

An object of the present invention is, in consideration of the above described problems, to provide a transmission electron microscope that is capable of capturing a continuous field-of-view image without having an influence of aberration.

A transmission electron microscope of the present invention specifies a region with little aberration in a field of view of an image pickup device in order to obtain an entire electron beam image of a sample in the entire region predetermined. Then the transmission electron microscope of the present invention captures an image of the entire region mentioned above as the continuous field-of-view images by transferring the sample stages with the use of the above mentioned region as a unit.

According to the present invention, a transmission electron microscope capable of capturing continuous field-of-view images with avoiding the influence of aberration is provided.

DESCRIPTION OF THE PREFERRED EMBODIMENTS

Embodiments of the transmission electron microscope of the present invention will be set forth below with reference to the drawings.

Figure 1:
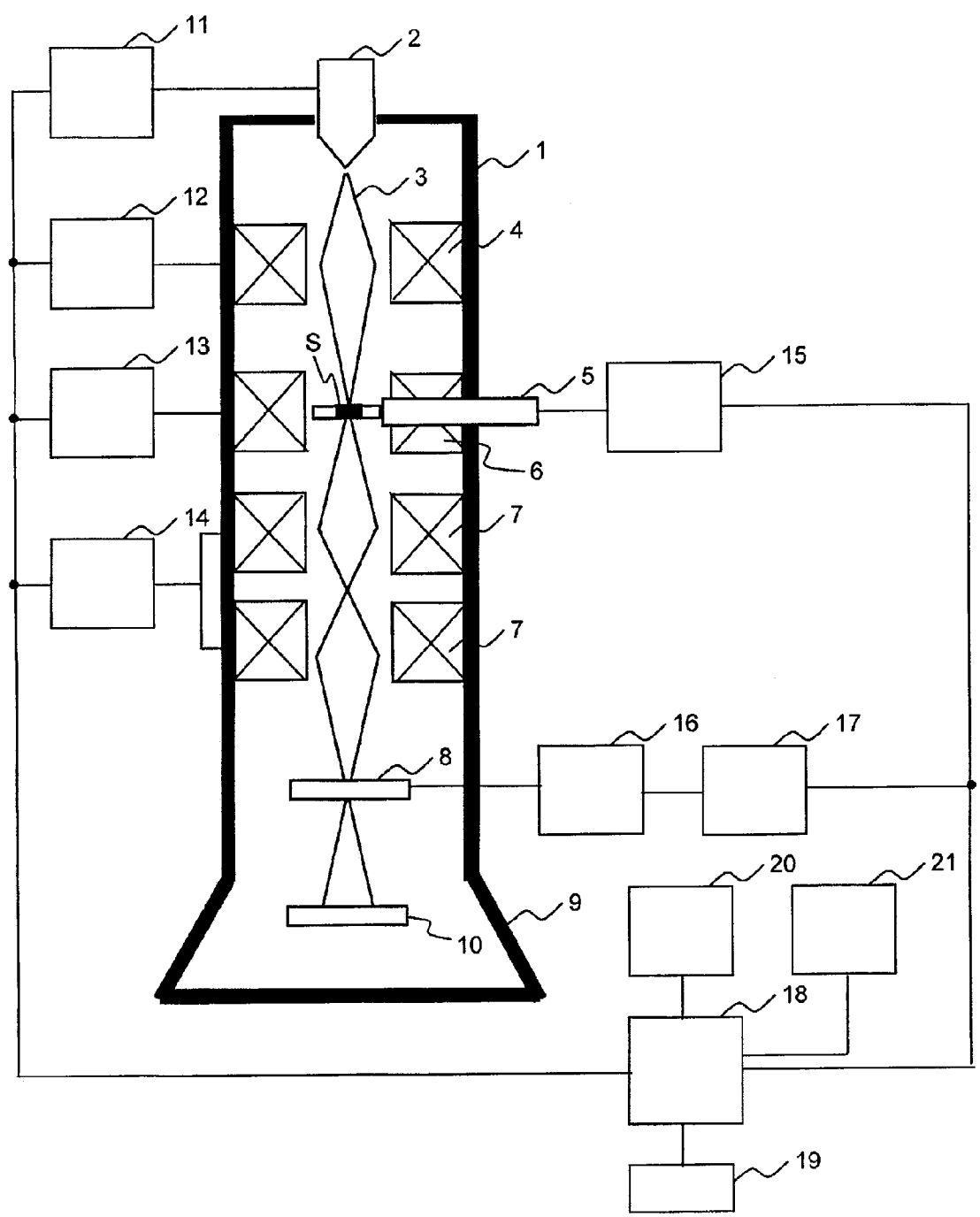
FIG. 1 is a schematic diagram indicating one example of the constitution of the transmission electron microscope of the present invention.

FIG. 1 is a schematic diagram indicating one example of a constitution of a transmission electron microscope of the present invention. A sample S held in a sample stage is irradiated with an electron beam 3 emitted from an electron gun of an electron microscope body 1 through an irradiation lens 4. Then, the electron beam 3 passing through the sample S is magnified by an objective lens 6 and a magnifying lens system 7 to be projected onto an image pickup device 8 such as a CCD camera.

The electron gun 2 is controlled by an electron gun controlling device 11. The irradiation lens 4 is controlled by an irradiation lens controlling device 12. The objective lens 6 is controlled by an objective lens controlling device 13. The magnifying lens system 7 is controlled by a magnifying lens system controlling device 14. A sample stage driving mechanism 5 is controlled by a sample stage driving mechanism controlling device 15. An observation conditions controlling device includes the electron gun controlling device 11, the irradiation lens controlling device 12, the objective lens controlling device 13, the magnifying lens system controlling device 14 and the sample stage driving mechanism controlling device 15.

The electron beam 3 passing through the sample S is projected onto the image pickup device 8 which is provided with a scintillator plate and image pickup elements such as CCD, and then is supplied to an image-pickup-device controlling device 16 to be transformed into an image signal. The transformed image signal is displayed as an image on a monitor 17. At the same time, the image signal outputted from the image-pickup-device controlling device 16 is supplied to an image processing device 18, is memorized as an image data and is then stored. A specified input instrument 19 such as a keyboard, an image display monitor 20 and an analyzing monitor 21 are connected to the image processing device 18.

The lower end of the electron microscope body 1 forms a camera chamber 9 and therein is disposed a fluorescent screen 10. Hence, by removing the image pickup device 8 from the pathway of the electron beam 3 using a mechanism not shown here, an image of the sample S magnified by the electron beam 3 can be observed on the face of the fluorescent screen 10.

In the electron microscope of the present invention, a region in which the amount of aberration is within an allowable range is previously identified in a field-of-view image captured by the image pickup device 8. When imaging a desired image capturing range of a sample, the electron microscope captures continuous field-of-view images while driving a moving stage in units of the above regions. Then a montage image is obtained by linking the captured continuous field-of-view images.

The image-capturing-conditions setting devices of the electron microscope, specifically the electron gun controlling device 11, the irradiation lens controlling device 12, the objective lens controlling device 13, the magnifying lens system controlling device 14 and the sample stage driving mechanism controlling device 15, are all connected to the image processing device 18 by way of specified transmission lines, whereby of the data can be mutually communicated. The drive control of the sample stage and the observation conditions of each lens can be set by the image processing device 18.

Consequently, the image processing device 18 includes, for example, a computer loaded therein a predetermined program, whereby the image processing device 18 can generate control data needed for controlling the above mentioned observation conditions setting devices by providing the data to above mentioned respective devices.

Upon capturing an image of a sample, an operator prepares the sample S to be a capturing target, operates an electron microscope and sets predetermined capturing conditions. This time, the operation is executed using the input instrument 19, and the controlling data predetermined are inputted respectively into the electron gun controlling device 11, the irradiation lens controlling device 12, the objective lens controlling device 13, the magnifying lens system controlling device 14, so that a desired acceleration voltage, magnification, and observation mode can be obtained. At this time, a position coordinate of the sample stage driving mechanism 5 is automatically transmitted to the image processing device 18 which is connected to the sample stage driving mechanism controlling device 15.

The sample stage driving mechanism 5 is moved so that a desired portion of the sample S is to be within a capturing range. At this time also, synchronized with the drive of the sample stage, the position coordinate of the sample stage driving mechanism 5 is transmitted from the sample stage driving mechanism controlling device 15 to the image processing device 18, so that the driving conditions of the sample stage is to be monitored all the time. The driving conditions of the sample stage are also displayed on the monitor 20. Here, a trace of movement of the sample stage may be marked on the monitor. This makes the movement of the sample stage easily seen. The image processing device 18 incorporates, in addition to the position information of the sample stage, mechanisms of controlling the driving conditions of the sample stage such as the amount in movement of the sample stage, the number of captured continuous field-of-view images, and the designation of a capturing range or the like.

During capturing the image of the sample S, an operator sets driving conditions such as the number of continuous field-of-view images and a capturing initial position or the like into the image processing device 18. Although the operation at this time is carried out using the input instrument 19, the driving condition may be automatically set by the image processing device 18. In addition, the movement speed of a sample stage may be subject to change. For the prevention of thermal drift of a sample caused by electron beam irradiation, a wait time prior to capturing of a field of view may be provided. Additionally, for the prevention of the mechanical drift of a sample stage, the sample stage driving mechanism controlling device 15 may be mechanically deviated in a large extent relative to a driving axis direction so as to introduce the performance for reducing sample drift.

The performance of such a transmission electron microscope of the present invention will be set forth below in detail using flowcharts. In the present embodiment, "image recording process" and "image analysis process" are executed by the image processing device 18. "Image recording process" refers to a process of continuously capturing field-of-view images over a desired capturing range on the sample S in connection with a sample stage driving mechanism. "Image analysis process" refers to a process of linking continuous field-of-view images captured by "image recording process."

Figure 2:
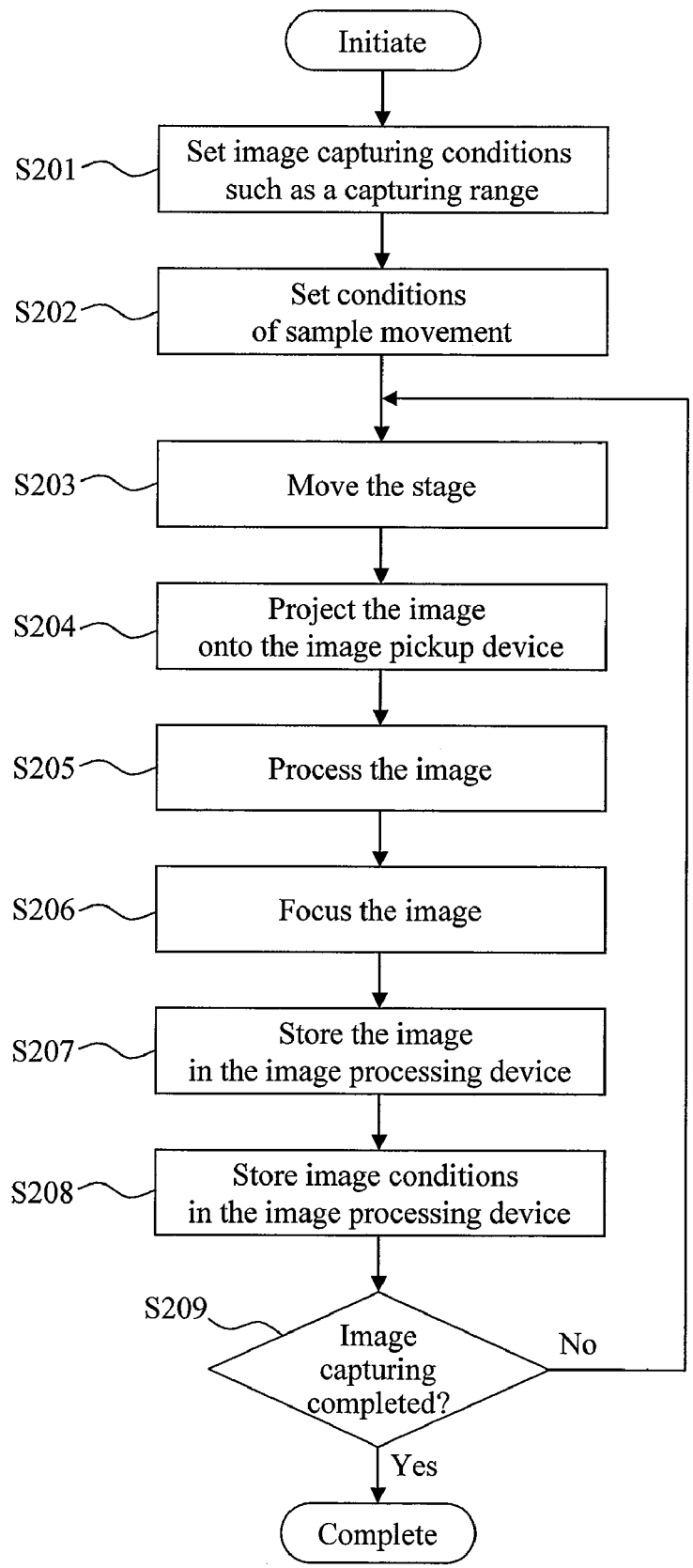
FIG. 2 shows a flowchart depicting the performance of image recording process.

FIG. 2 shows a flowchart depicting the performance of "image recording process" of the present embodiment. In a step S201, image capturing conditions such as a capturing range, the capturing number of continuous field-of-view images, the driving speed of a sample stage and a wait time during movement of a field of view or the like are inputted by the input instrument 19 referring to the image of the sample S displayed on the monitor 20. The number of continuous field-of-view images to be captured may be, as described below, calculated by the image processing device 18 using such as the resolution of a linked image to be finally outputted. In a step S202, the conditions of sample movement (initial point, final point) are set by the input instrument 19.

In step S203, the sample stage driving mechanism controlling device 15 moves around the sample stages. In step S204, an image is projected to the image pickup device 8. In step S205, the image processing device 18 processes the image projected to the image pickup device 8, and transmits it to the magnifying lens system controlling device 14. In step S206, the magnifying lens system controlling device 14 focuses the image using the magnifying lens system 7 on the basis of the transmitted image. In step S207, the image processing device 18 stores the focused image (a field-of-view image). At the same time, in step S208, the image processing device 18 stores image conditions such as a sample position and capturing conditions. In step S209, whether or not the entire capturing range is captured is determined. In case not captured, the process flow is returned to the step S203 and the stage is moved and a next a field-of-view image is captured. The performance is completed when the entire capturing range is captured.

Figure 3:
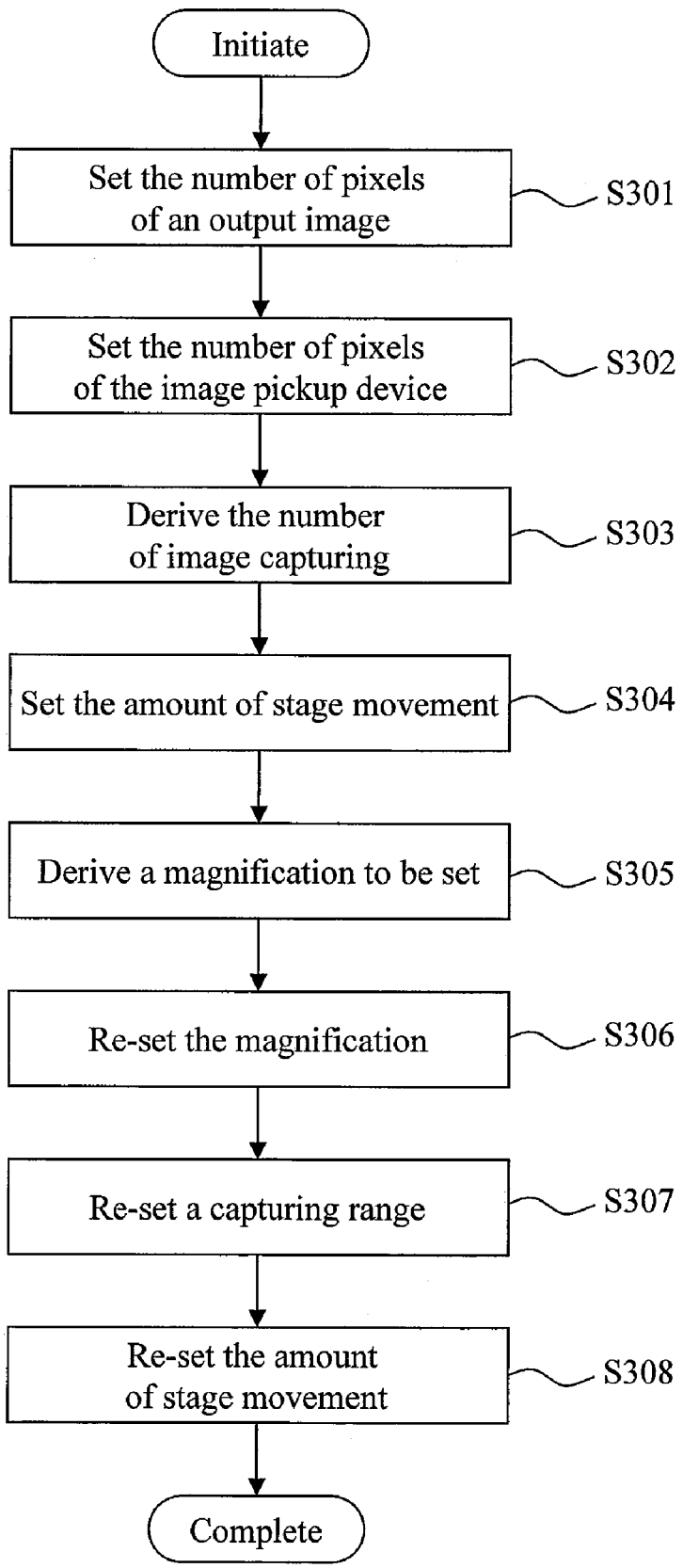
FIG. 3 shows a flowchart depicting the performance of setting of image capturing region of continuous fields of view.

In setting of the image capturing conditions of the step S201, the size of a field-of-view image is set subject to change depending on the resolution of an image, in a capturing range, to be finally outputted. Such setting of a field-of-view image will be described below with reference to the flowchart of FIG. 3.

In step S301, the number of pixels is set, of the image of the entire capturing range finally outputted after the linkage of continuous field-of-view images. The number of pixels Px and Py (pixel) of an output image are given by the following formulas:

$$Px = H*D/U$$

$$Py = V*D/U$$

(U refers to one inch), under the condition that the resolution of the final output image of an output image is D (units, dpi:

dot per inch, dot number for one inch), and the sizes of the output image are H (pixel) in the longitudinal direction (x direction) and V (pixel) in the lateral direction (y direction).

In a step S302, the number of pixels of the image pickup device 8 is set.

In a step S303, the number of capturing images is derived. When an image is captured using the image pickup device 8 with the number of pixels m*n (pixel), the number of capturing images T, as a product of the respective numbers of capturing images in the x and y directions, is calculated by the following formulas:

$$T=Tx*Ty$$

$$Tx=\text{integer}[(Px-\Delta p)/(m-\Delta p)+0.5]$$

$$Ty=\text{integer}[(Py-\Delta p)/(n-\Delta p)+0.5]$$

under the condition that the number of overlaps on the image pickup element of the image pickup device 8 when adjacent fields of view are captured is expressed by $\Delta p$ (pixel).

In step S304, the amount of stage movement is set. In a capturing region, the amount of sample stage movement in the x and y directions are calculated by the following formulas:

$$\Delta X=X/(Tx-1)$$

$$\Delta Y=Y/(Ty-1).$$

In step S305, a magnification to be set is derived. In the present embodiment, considering the resolution of an output image, the pixel size and the capturing region, the magnification to be set is automatically derived. In other words, the magnification M to be set is calculated by the following formulas:

$$X/Tx*M*R=W$$

$$\therefore M=W*Tx/(X/R) \; (=W*Ty(Y/R))$$

wherein the capturing range on the image pickup element of the image pickup device 8 expressed by W (μm) and the reduction ratio of the optical system is expressed by R.

However, the magnification derived here to be set for capturing an image satisfying the resolution, the capturing region and the pixel size are discrete numerical values, so it is reset in a step S306. In other words, the magnification M' which is most approximated to M, such that $1 \leq M/M' \; (=k)$, is set.

On the basis of the magnification M' set in this way, the actual capturing range is set in a step S307. The image pickup ranges X' and Y' on the actual sample are calculated by the following formulas:

$$M=W*Tx/(X*R) \; (=W*Ty/(Y*R))$$

$$M'=W*Tx/(X'*R) \; (=W*Ty/(Y'*R))$$

$$X'=kX$$

$$Y'=kY.$$

In a step S307, the amount in movement of an actual sample stage is set. Here also, on the basis of M', the following formulas are given:

$$\Delta X'=X'/(Tx-1)$$

$$\Delta Y'=Y'/(Ty-1).$$

These conditions are inputted as image capturing parameters, into the image processing device 18.

The amount in movement to each field of view of the sample stage driving mechanism controlling device 15 may be limited to a region without including a large aberration region.

A sample may be mounted onto a mesh sample holder. In the case like this, the sample only at a hole part of the mesh sample holder can be captured as an image since the electron beam passes through only the hole part.

When the sample stage driving mechanism controlling device 15 is set to move the mesh sample holder in units of hole size, first, the width of a metal part of the mesh sample holder is inputted into the image processing device 18.

Next, the initial position and the moving direction of the sample stage are set in the same way as described above. Specifically, the moving direction in which the sample stage driving mechanism 5 moves the sample stage is set to be parallel to a linear line connecting the initial position to a next destination position.

When the sample stage moves and the metal part of the mesh holder reaches a position to receive an electron beam, an image signal is not sent to the image pickup device 8, since the electron beam does not pass through the metal part. In this manner, the extinction of an image signal in the image pickup device 8 is received by the image processing device 18 as another signal. Subsequently the signal is sent also to the sample stage driving mechanism controlling device 15, and the sample stage is assumed to have reached the end of the movement region. Then automatically, as in the similar way with above, the sample stage driving mechanism 5 determines where to move the sample stage for the next column of mesh holes, as a moving direction of the sample stage for the next column. The moving direction is determined to be one of the X and Y directions, that is, a direction being parallel to the moving direction of the first column as well as being opposite to the moving direction for the first column. This operation is executed on whole the mesh.

The movement to a next mesh hole is executed by setting the amount in movement based on the width of the metal part of the mesh sample holder inputted in the image processing device 18 in advance. In other words, when reaching the final region of a mesh hole, an electron beam does not pass through the final region. As a result, an image signal is not transmitted to the image pickup device 8. When such situation is detected, in other words, when an image signal is not transmitted to the image pickup device 8, the image processing device 18 sets the amount in movement equivalent to the extent of width of the metal part of the mesh sample holder in the sample stage driving mechanism controlling device 15 to thereby control the movement amount of the sample stage driving mechanism 5.

Figure 4:
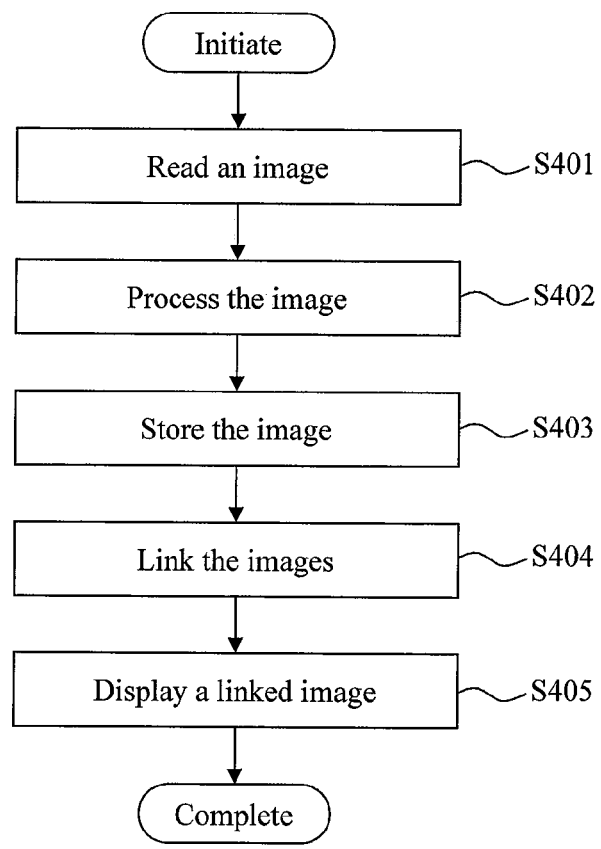
FIG. 4 shows a flowchart depicting the performance of image analysis process.

FIG. 4 shows a flowchart depicting the performance of the "image analysis process" of the present embodiment. In a step S401, the image processing device 18 reads an image (continuous field-of-view image) obtained by "image analysis process" described above. In a step S402, the image processing device 18 selects a region that does not include a region having a large image aberration and carries out image processing such as the correction of image aberration. The correction of aberration of an image will be set forth below. Subsequently, in a step S403, corrected images are linked. In the linkage process, overlapped regions of images with adjacent fields of view are cut out and the mutual relation of the images is determined. Using the coordinate of a position having the largest correlation value, a position relation between the images where the images are linked most naturally is derived and then the images are linked. Alternatively, images may be linked on the basis of the position information of the images. Furthermore, corrected images may be manually linked by displaying on the display device 20 which is attached to the image processing device 18. A montage image is displayed in a step S405.

In the present embodiment, "image recording process" and "image analysis process" may be implemented in parallel. Image aberration correction and linkage processing then may be carried out while recording images.

In the present embodiment, continuous fields of view are linked to a region in which the influence of aberration of an image is small.

In the case of a region in which the influence of aberration is large, images in which the aberrations of the captured images have been corrected may also be linked.

Figure 5:
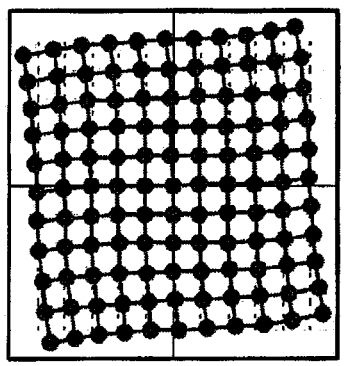
FIG. 5 is a schematic diagram indicating rotation aberration of an image and its correction method.
Figure 5:
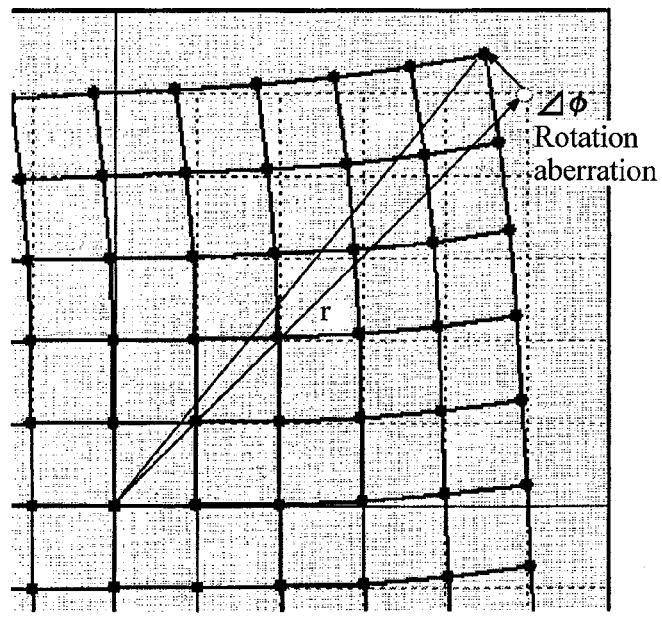
Figure 6:
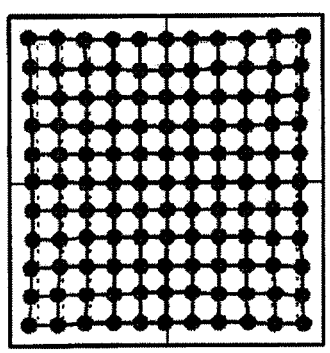
FIG. 6 is a schematic diagram indicating distorted aberration of an image and its correction method.
Figure 6:
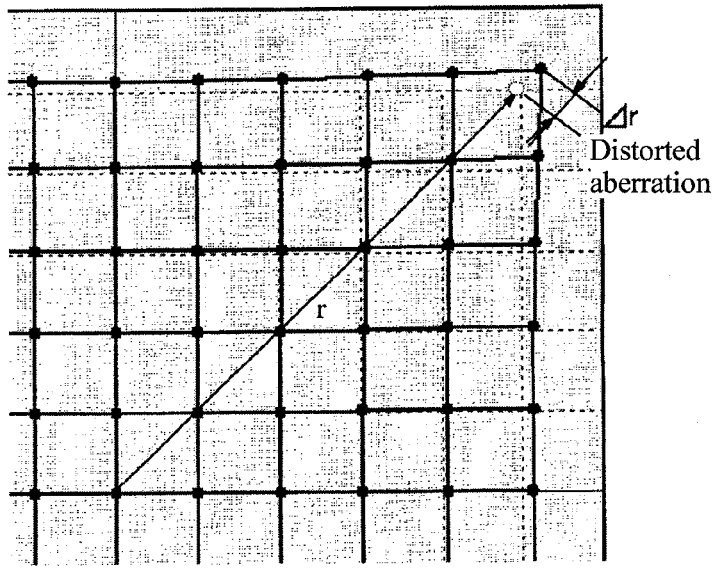

One example of the derivation and image correction in an image aberration region will be described. FIGS. 5 and 6 are schematic diagrams indicating the aberrations and the correction methods thereof. FIG. 5 indicates rotation aberration and its correction method; and FIG. 6 indicates distorted aberration and its correction method. As shown in these drawings, when a physical object on the sample moves on the sample stage, the position of the sample is deviated from the position controlled by the sample stage due to the influence of aberration.

For rotation aberration, the rotation $\Phi$ attributable to aberration is expressed by the following formula:

$$\Delta\Phi = \tan^{-1}(r^2 * Kr) \quad \text{Formula (1)}$$

in the condition that r represents the axis separation distance from the optical axis center of a physical object on a sample. Here, Kr represents a coefficient attributable to the lens.

Next, when distorted aberration (winder type) is observed, the amount of aberration $\Delta r$ is expressed by the following formula:

$$\Delta r = r^3 * Kp * M \quad \text{Formula (2)}$$

(Distortion rate=$\Delta r/r = r^2 * Kp * M$)

in the condition that r represents the axis separation distance from the optical axis center of a physical object on a sample. Here, Kp represents a coefficient attributable to the lens and M represents the lens magnification.

Figure 7:
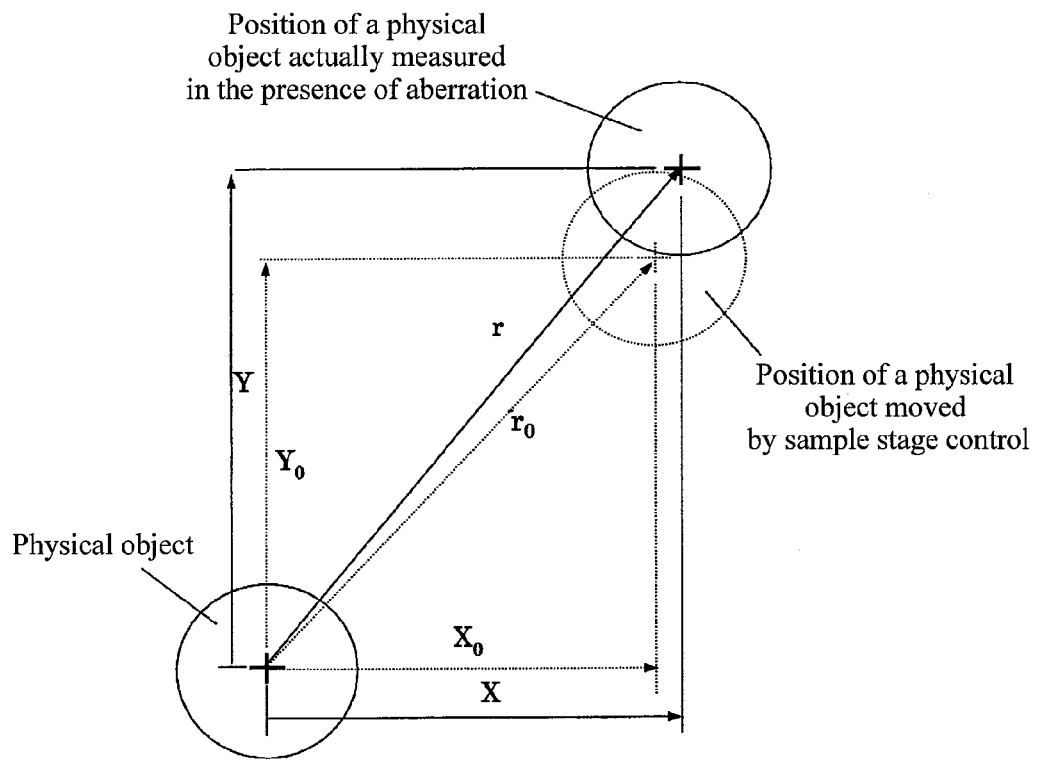
FIG. 7 is a schematic diagram depicting rotation aberration of an image and a lens coefficient.
Figure 8:
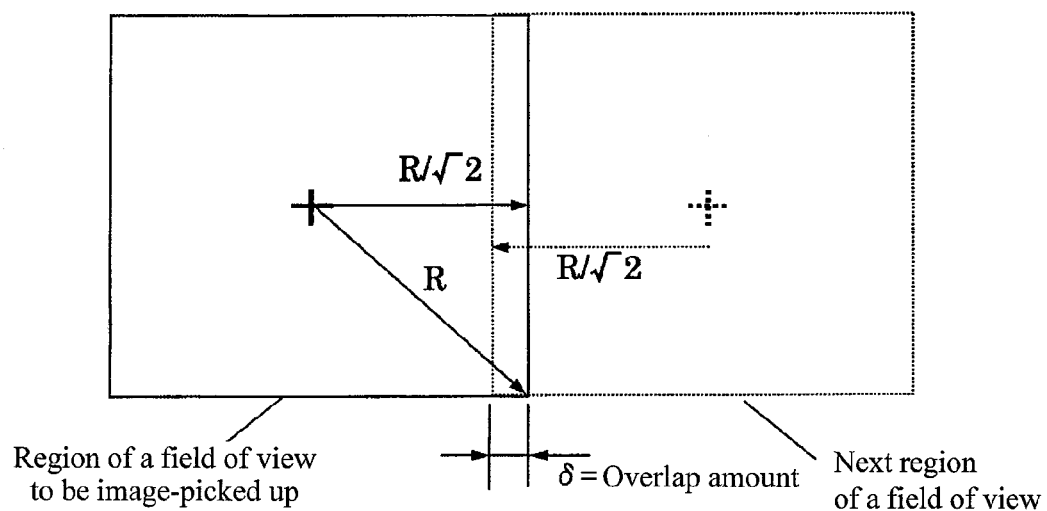
FIG. 8 is a schematic diagram depicting distorted aberration of an image and a lens coefficient.

Subsequently, as shown in FIGS. 7 and 8, the lens coefficients of Formulas (1) and (2) are derived in the following procedure. Firstly, a target physical object is moved on the sample stage to the center of a field of view on the optical axis. The sample position at this time is used as a reference, when an actual amount in movement is measured. The actual amount of the movement is measured by moving the physical object by controlling the sample stage at a certain amount in movement $r_0 (=(X_0^2+Y_0^2)^{1/2})$. The actual measured value r and $\Phi$ of rotation aberration and distorted aberration, are expressed in the following formulas;

$$r = r_0 + \Delta r_0 = r_0 + Kr * r_0^3 \quad \text{Formula (3)}$$

$$\Phi = \Phi_0 + \Delta\Phi_0 = \Phi_0 + \tan^{-1} Kp * r_0^2 \quad \text{Formula (4)}$$

wherein $\Phi = \tan^{-1}(Y/X)$ and $\Phi_0 = \tan^{-1}(Y_0/X_0)$. From Formulas (3) and (4), Kr and Kp are calculated by:

$$Kr = (r - r_0)/r_0^3$$

$$Kp = (\tan(\Phi - \Phi_0))/r_0^2.$$

By the use of Kr and Kp experimentally derived in this way, the distance from the optical axis and the amount of aberration from the magnification can be derived. When the range of $r_0$ in which the aberration amount satisfies $\Delta r_0/r_0 < A$ and $\Delta\Phi_0 < B$ is calculated and the amount in movement to a next field of view is set on the basis of the calculated value, it is possible to capture an image with a small influence of aberration. Note that, above A and B are to be set so that the amount of aberration is within the allowable level (e.g., A=1%, B=0.1°). Additionally, with R=MAX($r_0$), the amount of stage movement becomes $(\sqrt{2}-\delta)/M$. $\delta(\geq 0)$ here is an overlap amount.

In the present embodiment, images in which aberration is corrected can be linked. Herein, the procedure of correcting image aberration will be described by the use of Kr and Kp experimentally derived as described above.

Firstly, an image I(X,Y) is coordinate-converted in the following to evaluate I($X_0, Y_0$). That is, using Formula (3), the third order equation of $r_0^3$, $$r_0^3 + p * r_0 + q = 0 \quad (p=1/Kr, q=-r/K)$$

is obtained. Therefore, $$r_0 = (-q/2 + ((q/2)^2 + (p/3)^3)^{1/2})^{1/3} + (-q/2 - ((q/2)^2 + (p/3)^3)^{1/2})^{1/3} \quad \text{Formula (5)}$$

$$\Phi_0 = \Phi - \tan^{-1}(Kp * r_0^2) \quad \text{Formula (6).}$$

From Formulas (5) and (6), $$X_0 = r_0 * \cos\Phi_0 \text{ and}$$

$$Y_0 = r_0 * \sin\Phi_0$$

are obtained to thereby evaluate a corrected image subjected to coordinate-converted.

Hence, according to the transmission electron microscope of the present invention, continuous field-of-view image capturing in which the image aberration are corrected can be carried out, so consequently, the observation of a wide field of view becomes possible without distortion. In addition, a wide field of view without distortion are also obtained by the production of a continuous field of view using only a region not including the aberration of a sample image as described above. As the selection of an image pickup region is variable depending on the magnification, a clear continuous a field-of-view image can be obtained avoiding the influence of aberration which depends on the magnification. In particular, even in a low magnification, the observation of a clear wide field of view without distortion is possible. By setting the movement unit of a sample stage to be a region of a field of view not including a large aberration region, a continuous field of view without distortion can be captured. Additionally, in a case where a digital camera is used for capturing a sample image, the number of fields of view to be captured is set so that the image density becomes constant. As a consequence, the observation of a continuous field of view of a digital image is possible without impairing the resolution of the image.

Here, in the conventional art, a means for removing an aberration region appeared on an image or a means for correcting an image are not taken into consideration, whereby a continuous field of view avoiding the influence of aberration cannot be captured. As the conventional parameters for image capturing are not set in consideration of a final resolution, capturing a continuous field of view was impossible while maintaining the resolution of each image.

According to the present invention, in a transmission electron microscope, the linkage of continuous fields of view by the use of an image in which image aberration is corrected renders it possible to obtain an observed image of a wide field of view without image distortion. The selection of only a region not including image aberration enables continuous fields of view to be efficiently linked by capturing the continuous fields of view. The image linkage can be precisely implemented with the image processing such as image correlation on a corrected image.

In addition, once the capturing region is set in advance, the number of continuous fields of view can be set to create montage photo without impairing the resolution of each image.

The present invention is applicable to a transmission electron microscope.

What is claimed is:

1. A transmission electron microscope comprising:
an electronic gun for generating an electron beam;
a focused optical system for focusing the electron beam generated;
a sample stage for placing a sample thereon;
a driving part for driving the sample stage;
a magnification optical system for magnifying an electron beam image having passed through the sample;
an image capturing device for capturing the magnified electron beam images; and
a controller for controlling each part of the device, and for recording and processing the captured electron beam image, wherein
the controller causes the sample stage to sequentially move in units of predetermined regions so that the magnified electron beam image is captured as a plurality of continuous field-of-view images, the predetermined region being a part of a field of view of the electron beam image, the part having an amount of aberration equal to or less than a predetermined value.

2. The transmission electron microscope according to claim 1, wherein
the controller records the amount in movement of the sample stage in association with a field-of-view image captured.

3. The transmission electron microscope according to claim 1, wherein
the controller links a plurality of captured continuous field-of-view images.

4. The transmission electron microscope according to claim 1, wherein
the controller corrects the aberration of a plurality of captured continuous field-of-view images and then links the images thus corrected.

5. The transmission electron microscope according to claim 1, further comprising:
an input part for inputting a capturing range, wherein the controller captures the whole of the inputted capturing range as a plurality of continuous field-of-view images.

6. The transmission electron microscope according to claim 5, wherein
the controller sets the number of continuous field-of-view images to capture the capturing range at a predetermined resolution.

7. An image capturing method by a transmission electron microscope, comprising:
an electron beam irradiating step of irradiating a sample placed on a sample stage with an electron beam;
an electron beam image magnifying step of magnifying an electron beam image having passed through the sample;
a sample stage moving step of sequentially moving the sample stage in units of predetermined regions, the predetermined region being a part of a field of view of the electron beam image, the part having an amount of aberration equal to or less than a predetermined value;
an image capturing step of capturing the magnified electron beam image in connection with the movement of the sample stage.

8. The image capturing method by a transmission electron microscope according to claim 7, further comprising:
a movement amount recording step of recording the amount in movement of the sample stage in association with a captured field-of-view image.

9. The image capturing method by a transmission electron microscope according to claim 7, further comprising:
a field-of-view image linking step of linking a plurality of captured field-of-view images.

10. The image capturing method by a transmission electron microscope according to claim 7, further comprising:
an aberration correcting step of correcting aberration in a plurality of captured field-of-view images; and
a field-of-view image linking step of linking aberration-corrected continuous field-of-view images.

11. The image capturing method by a transmission electron microscope according to claim 7, further comprising:
an image capturing range inputting step of inputting a capturing range, wherein
in the image capturing step, the whole of the capturing range inputted in the capturing range inputting step is captured as a plurality of continuous field-of-view images.

12. The image capturing method by a transmission electron microscope according to claim 11, wherein
in the image capturing step, the number of continuous field-of-view images is set to allow the capturing range to be captured at a predetermined resolution.

* * * * *